(12) United States Patent
Huseh

(10) Patent No.: US 6,833,580 B2
(45) Date of Patent: Dec. 21, 2004

(54) SELF-ALIGNED DUAL-BIT NVM CELL AND METHOD FOR FORMING THE SAME

(75) Inventor: Cheng-Chen Calvin Huseh, Taipei (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 10/429,710

(22) Filed: May 6, 2003

(65) Prior Publication Data
US 2004/0222455 A1 Nov. 11, 2004

(51) Int. Cl.[7] .............................................. H01L 29/788
(52) U.S. Cl. ....................................... 257/315; 257/317
(58) Field of Search .................................. 257/315, 317

(56) References Cited

U.S. PATENT DOCUMENTS 6,093,945 A * 7/2000 Yang ............................ 257/317

* cited by examiner

Primary Examiner—Hoai Ho
Assistant Examiner—Tu-Tu Ho
(74) Attorney, Agent, or Firm—Birch, Stewart, Kolasch & Birch, LLP

(57) ABSTRACT

A self-aligned dual-bit NVM cell. Each NVM cell has two isolated chargeable areas storing one bit respectively. That is, the two chargeable areas are physically separated. A control gate and a passivation layer are disposed over and between the two isolated chargeable areas. Moreover, the two isolated chargeable areas are formed by a self-alignment process.

3 Claims, 6 Drawing Sheets

SELF-ALIGNED DUAL-BIT NVM CELL AND METHOD FOR FORMING THE SAME

BACKGROUND OF THE INVENTION

1. Field of the Invention

The present invention relates in general to a nonvolatile memory cell (NVM cell). In particular, the present invention relates to a self-aligned dual-bit NVM cell and method for forming the same.

2. Description of the Related Art

The process of creating NVM cells is shown in FIGS. 1A, 1B and 1C. The ONO layers 10, 12 and 14 must be laid down on the p-type silicon substrate 16 and then etched to the desired size and shape. The etching is produced by first patterning a layer of photoresist 18 on top of the ONO layer in the places where the ONO is desired. An etch operation is then performed, to remove the upper oxide and nitride layers 14 and 12, respectively, but the etch affects only the places where there is no photoresist. The cells 20 of ONO are defined after etching.

As shown in FIG. 1B, an implant operation occurs (shown by arrows 30) which implants ions, such as Arsenic or Phosphorous, into the areas between the cells 20. This creates n-type source and/or drain areas 32 for the memory array cells in the p-type silicon substrate 16. The source/drain areas 32 are called bit lines.

As shown in FIG. 1C, a pocket implant 34 is provided at an angle to the right of vertical to form the left bit line junctions 36 of the channels.

As shown in FIG. 1D, another pocket implant 38 is provided at an angle at the same angle as before; however, for the right bit line junctions 40 of the channels, the implant angle is to the left of vertical.

After the lower oxide layer 10 and the photoresist 18 are removed, a thick bit line oxide 24 is then grown (FIG. 1E) between neighboring cells 20 to protect bit lines 32 and to electrically isolate neighboring cells 20.

Such NVM cells can store dual bit data in one cell, with one bit on either side of the cell, as shown in FIG. 2. The cell has a single channel 42 between two bit lines $BL_1$ and $BL_2$ but two separate and separately chargeable areas 12a and 12b. The chargeable areas 12a and 12b are within the nitride layer 12, and each chargeable areas 12a and 12b stores one bit.

Unfortunately, the charges stored in the chargeable areas 12a and 12b within the nitride layer 12 may disturb each other.

SUMMARY OF THE INVENTION

The object of the present invention is to provide a dual-bit NVM cell that can prevent the chargeable areas within the nitride layer from disturbing each other.

Another object of the present invention is to provide a method of forming the self-aligned dual-bit NVM cell, which can prevent the chargeable areas within the nitride layer from disturbing each other.

To achieve the above-mentioned object, the present invention provides a dual-bit NVM cell comprising a channel, two bit lines disposed on either side of the channel in columns, two isolation lines disposed on the bit lines, a control gate located over the isolation lines and on the channel in rows, a passivation layer disposed under the control gate, two isolated chargeable areas composed of nitride disposed on either side of the channel, a bottom oxide layer, and a top oxide layer. The control gate and the passivation layer are disposed over and between the two isolated chargeable areas. The bottom oxide layer is disposed over the bit lines and the channel and under the chargeable areas, the isolation lines and the passivation layer. The top oxide layer is disposed over the chargeable areas and under the isolation lines and the passivation layer. The isolated chargeable areas are located between the top oxide layer and the lower oxide layer.

A method for forming a dual-bit NVM cell is also provided. An oxide-nitride-oxide (ONO) layer is formed on a substrate, wherein the ONO layer is formed of a bottom oxide layer, a nitride layer, and a top oxide layer. A mask layer is formed on the ONO layer in columns. Bit lines are formed in the substrate using the mask layer as an implanting-obstructed layer. An isolation layer is formed between the mask layers in columns, which are then removed. A polymer layer is coated on the isolation layer, wherein the thickness of the polymer layer at the top and sidewall of the isolation layer is far greater than at the top oxide layer. The top oxide layer and the nitride layer are etched so as to define the nitride layer between the isolation layer into two isolated chargeable areas, and the polymer layer is then removed. Rows of control gate are formed perpendicular to the bit lines and on the isolation layer and the ONO layer.

BRIEF DESCRIPTION OF THE DRAWINGS

The preferred embodiment of the invention is hereinafter described with reference to the accompanying drawings in which.

DETAILED DESCRIPTION OF THE INVENTION

Figure 3A:
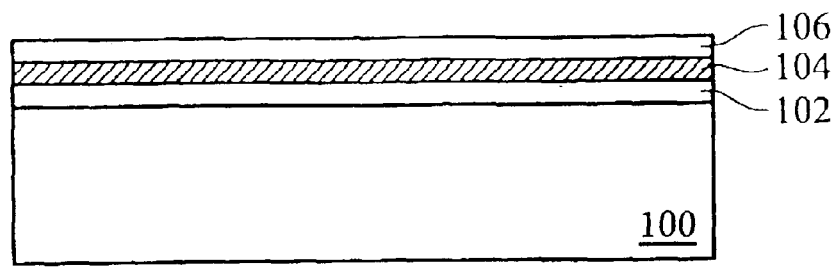
FIGS. 3A–3F are cross-sections showing the method of manufacturing NVM cells according to the preferred embodiment of the present invention.

As shown in FIG. 3A, an oxide layer 102, a nitride layer 104, and an oxide layer 106, respectively, are grown on top of a substrate 100, to form the basis of the ONO structure. Typical thickness of layers 102, 104 and 106 are about 50–70 Å, 50–60 Å and 80–100 Å, respectively.

Figure 3B:
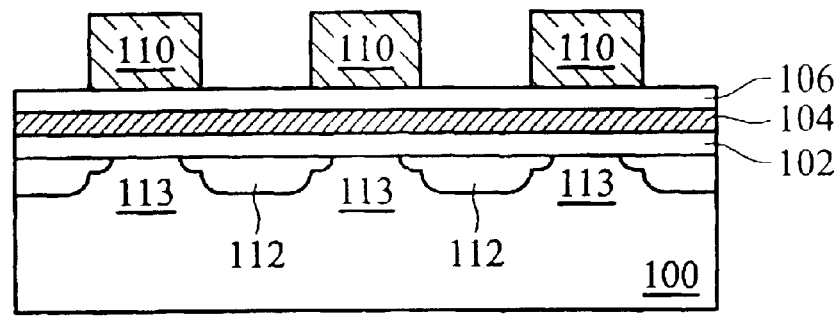

As shown in FIG. 3B, a mask layer 110 is formed of columns on the ONO structure, and corresponding to the locations of the channels. The mask layer 110 can be silicon nitride. The thickness of the mask layer 110 is preferably 500–2500 Å.

The bit lines 112 are then implanted between the columns of the mask layer 110 in the substrate 100. Between the bit lines 112 are channels 113. The dopant can be phosphorous.

Figure 3C:
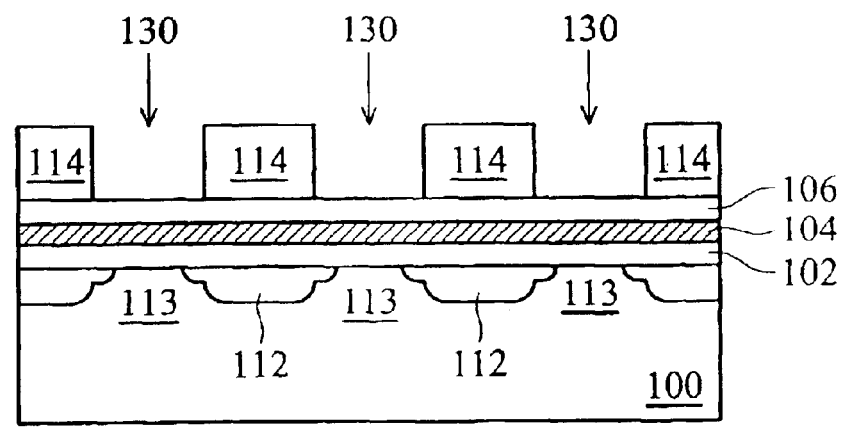

As shown in FIG. 3C, an isolation layer 114 is formed of columns between the mask layer 110 on the ONO structure. The isolation layer 114 can be silicon oxide, and the isolation layer 114 is initially deposited by high density plasma (HDP) deposition, then removed by chemical mechanical polishing (CMP). The remaining oxide layer is located between neighboring cells 130 to electrically isolate neighboring cells 130 from each other. The mask layer 110 is then removed.

Figure 3D:
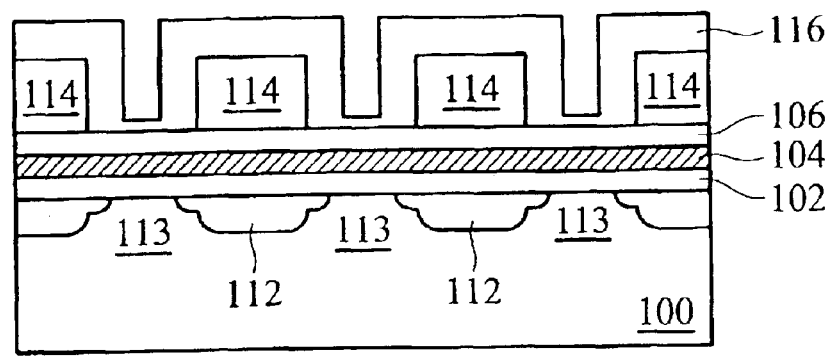

As shown in FIG. 3D, a polymer layer 116 is coated on the isolation layer 114, and the thickness of the polymer layer 116 at the top and sidewall of the isolation layer 114 is far greater than at the top oxide layer 106, which is almost without coating on the top surface of the ONO structure. The thinner polymer layer 116 cannot withstand etching like the thicker polymer layer 116. The thickness of the polymer layer 116 at the sidewall of the isolation layer 114 depends on requirements. For example, the thickness of the polymer layer 116 at the sidewall of the isolation layer 114 may be about ⅓ of the distance between the isolation layer 114. The polymer layer 116 can be formed with hydrocarbon polymer by chemical vapor deposition.

Figure 3E:
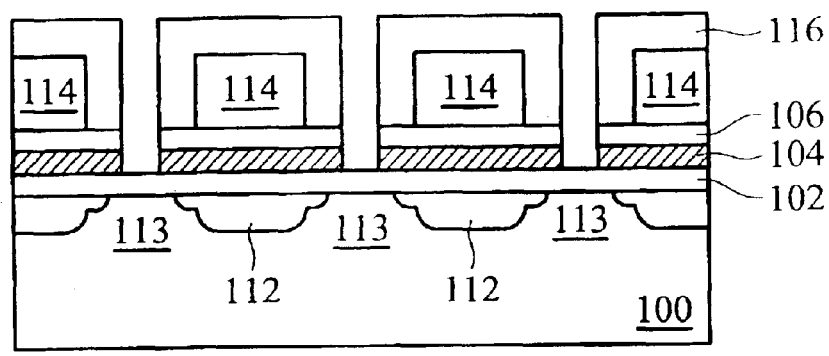

As shown in FIG. 3E, anisotropic etching is conducted with the polymer layer 116 as an etching obstructed layer until the nitride layer 104 is cut. After etching, the oxide layer 106 and the nitride layer 104 are transformed into the oxide layer 106a and the nitride layer 104a. The gap between the nitride layer 104a is about ⅓ of the gap between the isolation layer 114. The polymer layer 116 is then removed.

Figure 3F:
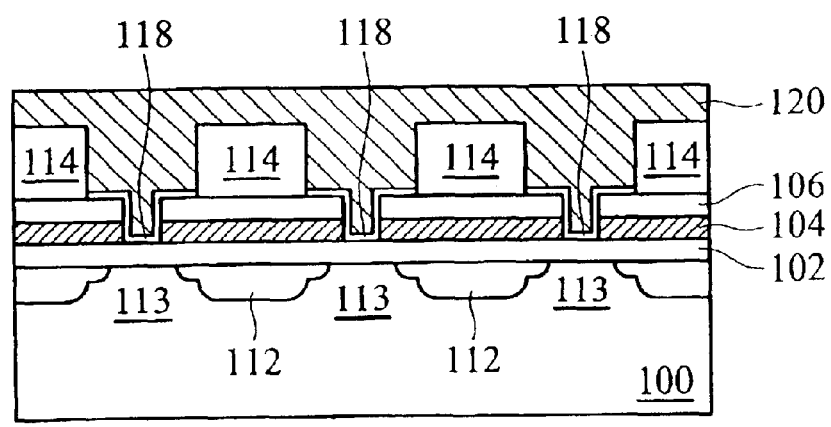

As shown in FIG. 3F, a passivation layer 118 protectively covers the surface of the ONO structure since the top oxide layer 106a and the bottom oxide layer 102 may be damaged and partially removed in the above-mentioned etching process. The passivation layer 118 is silicon oxide, and can be formed by wet rapid thermal oxidation.

The control gates 120 are formed of rows on the oxide layer 118 and the isolation layer 114, which is substantially perpendicular to the isolation layer 114.

Figure 1A:
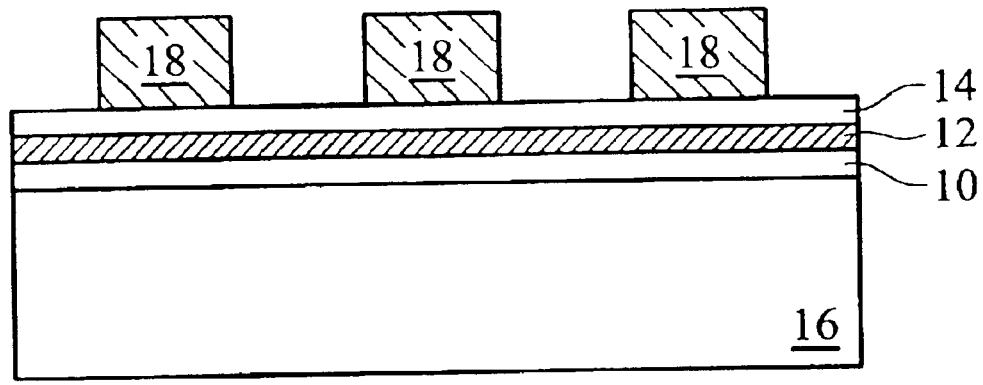
FIGS. 1A–1E are schematic illustrations of a prior art method of manufacturing NVM.
Figure 1B:
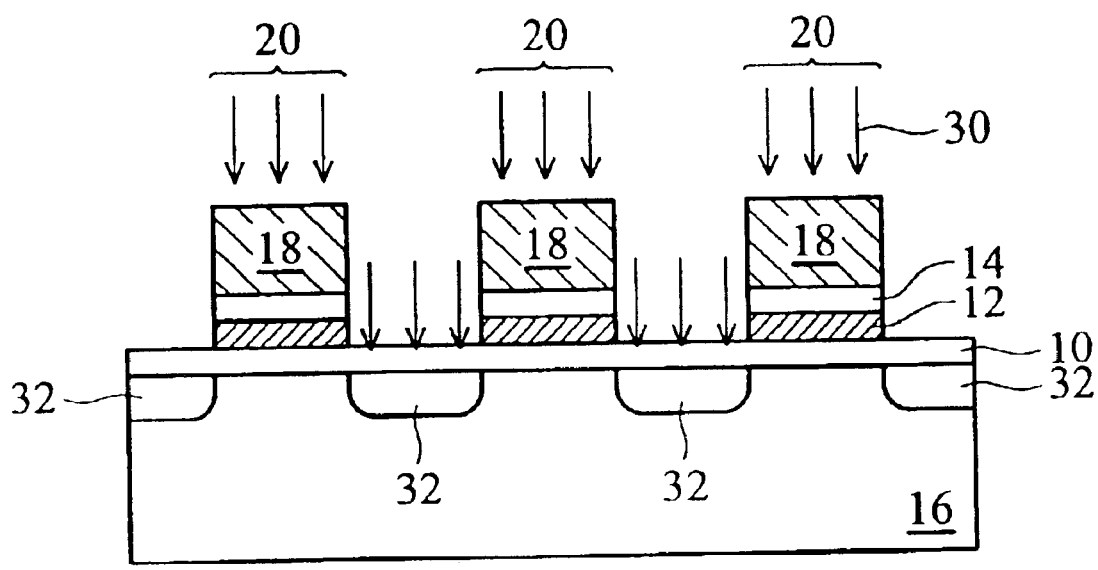
Figure 1C:
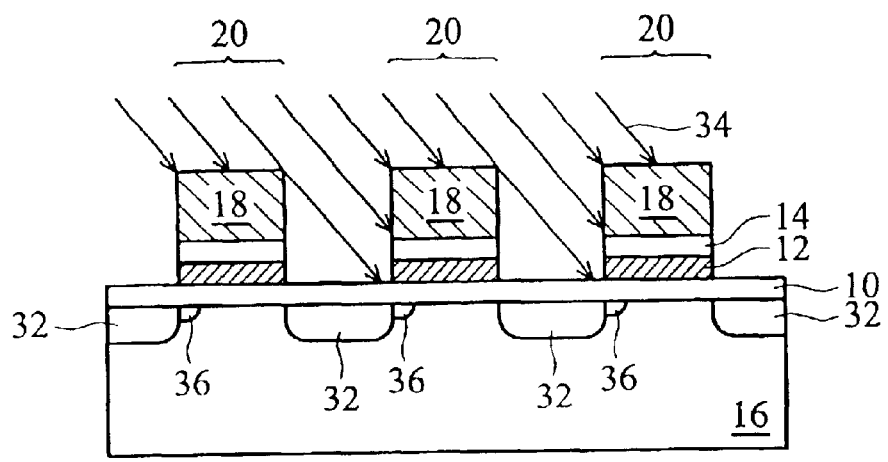
Figure 1D:
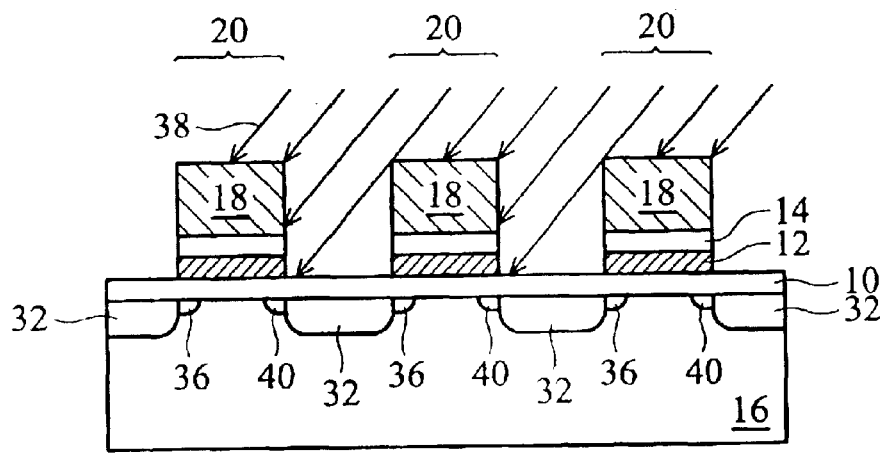
Figure 1E:
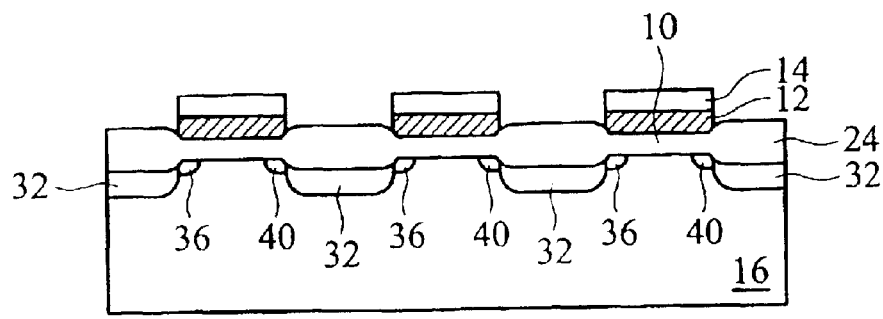
Figure 2:
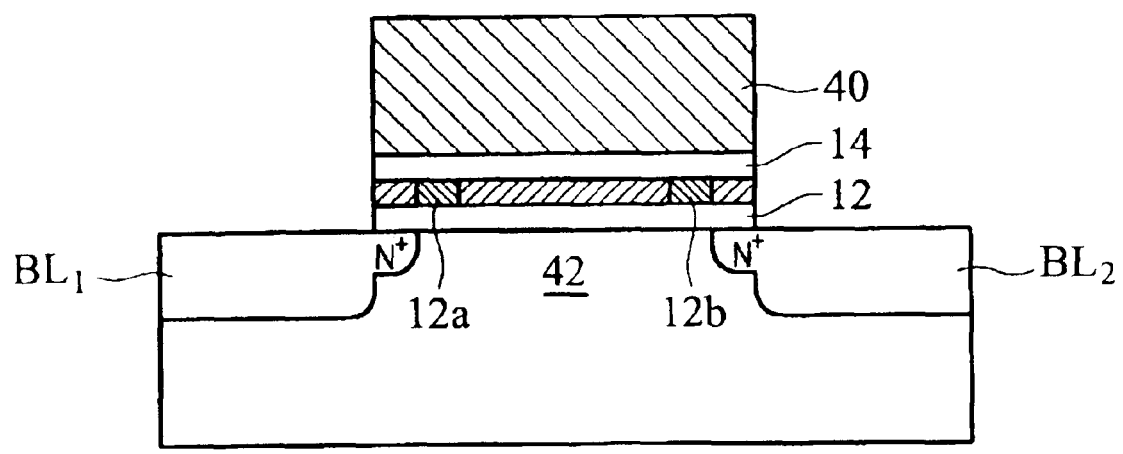
FIG. 2 is a schematic illustration of the chargeable areas of the prior art NVM.
Figure 4:
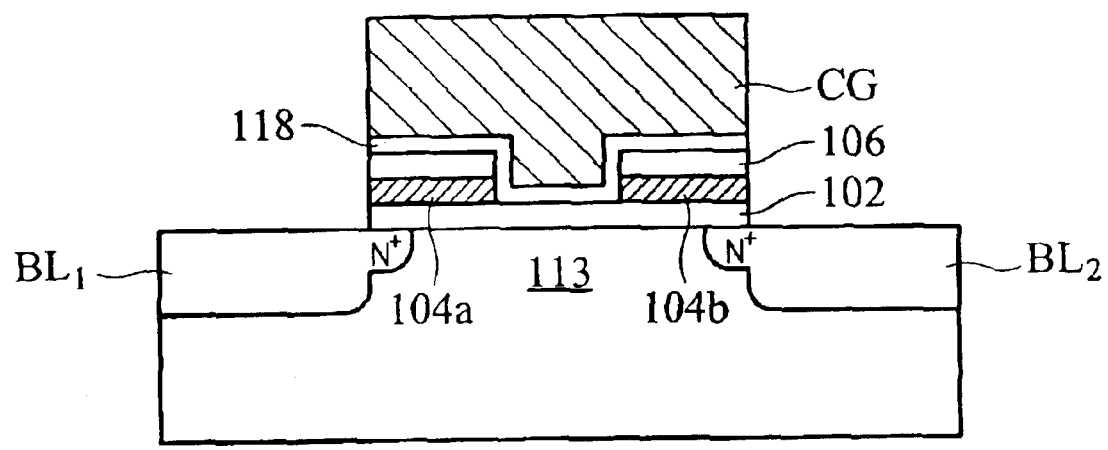
FIG. 4 shows one NVM cell structure according to the preferred embodiment of the present invention.

FIG. 4 simply shows one NVM cell structure. When operating this selected cell, the voltages of the control gate CG and bit lines BL1 and BL2 are involved. Each NVM cell 130 has two isolated chargeable areas 104a and 104b storing one bit respectively. That is, the two chargeable areas 104a and 104b are physically separated, unlike in the prior art (as shown in FIG. 2). In such structure, when the NVM cell is operated, carriers do not shift to the middle between two chargeable areas, resulting in freedom from disturbance. Thus, the reliability of the NVM devices is enhanced.

As well, although two chargeable areas sharing the same bit line in different cells exist in the same nitride layer, that is, are not physically separate, it does not affect operating results. This is because the control gate 120 corresponding to the areas of the bit line BL1 or BL2 is far away from the nitride layer and does not allow carriers to be trapped in such areas.

Further, the two isolated chargeable areas 104a and 104b are formed by a self-alignment process, so fabrication is simple.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A self-aligned dual-bit NVM cell, comprising:

a channel;

two bit lines, one on either side of the channel in columns;

two isolation lines, on the bit lines;

a control gate, over the isolation lines and on the channel in rows;

a passivation layer disposed under the control gate;

two isolated chargeable areas composed of nitride, one on either side of the channel, wherein between the two isolated chargeable areas is the control gate and the passivation layer;

a bottom oxide layer, over the bit lines and the channel and under the chargeable areas, the isolation lines and the passivation layer; and a top oxide layer, over the chargeable areas and under the isolation lines and the passivation layer, wherein the isolated chargeable areas are located between the top oxide layer and the lower oxide layer.

2. The cell as claimed in claim 1, wherein the passivation layer is an oxide layer.

3. The cell as claimed in claim 1, wherein the isolated chargeable areas on either side of the channel are located over the bit lines.

* * * * *